(12) United States Patent  
Itose et al.

(10) Patent No.: US 9,054,196 B2  
(45) Date of Patent: Jun. 9, 2015

(54) SPUTTERING TARGET COMPRISING AN OXIDE SINTERED BODY COMPRISING IN, GA, AND ZN

(75) Inventors: Masayuki Itose, Sodegaura (JP); Mami Nishimura, Sodegaura (JP); Hirokazu Kawashima, Sodegaura (JP); Misa Sunagawa, Sodegaura (JP); Masashi Kasami, Sodegaura (JP); Koki Yano, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/116,328

(22) PCT Filed: May 1, 2012

(86) PCT No.: PCT/JP2012/002944  
§ 371 (c)(1),  
(2), (4) Date: Dec. 11, 2013

(87) PCT Pub. No.: WO2012/153494  
PCT Pub. Date: Nov. 15, 2012

(65) Prior Publication Data  
US 2014/0084289 A1   Mar. 27, 2014

(30) Foreign Application Priority Data  
May 10, 2011   (JP) ................... 2011-105721

(51) Int. Cl.  
*H01L 29/10* (2006.01)  
*H01L 29/786* (2006.01)  
(Continued)

(52) U.S. Cl.  
CPC .............. *H01L 29/786* (2013.01); *C04B 35/01* (2013.01); *C04B 35/453* (2013.01);  
(Continued)

(58) Field of Classification Search  
CPC ......................... H01L 29/7869; H01L 21/16  
USPC ............................................. 257/43; 438/85  
See application file for complete search history.

(56) References Cited

U.S. PATENT DOCUMENTS

2009/0020753 A1   1/2009  Jeong et al.  
2009/0189153 A1   7/2009  Iwasaki et al.  
(Continued)

FOREIGN PATENT DOCUMENTS

JP   2006-114928   4/2006  
JP   2007-212699   8/2007  
(Continued)

OTHER PUBLICATIONS

International Search Report and Written Opinion received in International Application No. PCT/JP2012/002944 dated Nov. 21, 2013.  
(Continued)

*Primary Examiner* — Jami M Valentine  
(74) *Attorney, Agent, or Firm* — Foley & Lardner LLP

(57) ABSTRACT

A thin film transistor including an active layer, and has a field-effect mobility of 25 cm$^2$/Vs or more, the active layer being formed of an oxide that includes In, Ga, and Zn in an atomic ratio that falls within the following region 1, region 2, or region 3, the region 1 being defined by $0.58 \leq \text{In}/(\text{In}+\text{Ga}+\text{Zn}) \leq 0.68$ and $0.15 < \text{Ga}/(\text{In}+\text{Ga}+\text{Zn}) \leq 0.29$, the region 2 being defined by $0.45 \leq \text{In}/(\text{In}+\text{Ga}+\text{Zn}) < 0.58$ and $0.09 \leq \text{Ga}/(\text{In}+\text{Ga}+\text{Zn}) < 0.20$, and the region 3 being defined by $0.45 \leq \text{In}/(\text{In}+\text{Ga}+\text{Zn}) < 0.58$ and $0.20 \leq \text{Ga}/(\text{In}+\text{Ga}+\text{Zn}) \leq 0.27$.

7 Claims, 3 Drawing Sheets

(51) Int. Cl.
*C04B 35/01* (2006.01)
*C04B 35/453* (2006.01)
*C04B 35/626* (2006.01)
*C04B 35/645* (2006.01)
*C23C 14/08* (2006.01)
*C23C 14/34* (2006.01)
*H01L 29/26* (2006.01)
*H01L 21/02* (2006.01)

(52) U.S. Cl.
CPC ...... *C04B 35/62675* (2013.01); *C04B 35/6455* (2013.01); *C04B 2235/3284* (2013.01); *C04B 2235/3286* (2013.01); *C04B 2235/40* (2013.01); *C04B 2235/5409* (2013.01); *C04B 2235/6562* (2013.01); *C04B 2235/6565* (2013.01); *C04B 2235/6567* (2013.01); *C04B 2235/6585* (2013.01); *C04B 2235/664* (2013.01); *C04B 2235/77* (2013.01); *C04B 2235/80* (2013.01); *C04B 2235/963* (2013.01); *H01L 29/7869* (2013.01); *C23C 14/086* (2013.01); *C23C 14/3414* (2013.01); *H01L 29/26* (2013.01); *H01L 21/02554* (2013.01); *H01L 21/02565* (2013.01); *H01L 21/02631* (2013.01)

(56) References Cited

U.S. PATENT DOCUMENTS

| | | |
|---|---|---|
| 2010/0108502 A1 | 5/2010 | Inoue et al. |
| 2010/0163876 A1* | 7/2010 | Inoue et al. ............ 257/59 |
| 2010/0289020 A1 | 11/2010 | Yano et al. |
| 2011/0168994 A1 | 7/2011 | Kawashima et al. |
| 2011/0240935 A1 | 10/2011 | Yano et al. |
| 2013/0146452 A1 | 6/2013 | Yano et al. |
| 2013/0285053 A1 | 10/2013 | Kawashima et al. |

FOREIGN PATENT DOCUMENTS

| | | |
|---|---|---|
| JP | 2007-281409 | 10/2007 |
| JP | 2009-021536 | 1/2009 |
| JP | 2009-253204 A | 10/2009 |
| JP | 2011-058011 | 3/2011 |
| WO | WO-2008/072486 A1 | 6/2008 |
| WO | WO-2009/075281 A1 | 6/2009 |
| WO | WO-2009/148154 A1 | 12/2009 |
| WO | WO-2010/070832 A1 | 6/2010 |
| WO | WO-2010/140548 A1 | 12/2010 |

OTHER PUBLICATIONS

Joon Chul Moon et al., Journal of the Korean Physical Society, vol. 53, No. 4, Oct. 2008, pp. 2029-2032.

Matsueda, Y., Required Characteristics of TFTs for Next Generation Flat Panel Display Backplanes, International TFT Conference 2010, S6, pp. 314-317.

Office Action issued in Japanese Application No. 2011-105721 dated Nov. 11, 2014.

* cited by examiner

US 9,054,196 B2

SPUTTERING TARGET COMPRISING AN OXIDE SINTERED BODY COMPRISING IN, GA, AND ZN

This application is the National Phase of PCT/JP2012/002944, filed May 1, 2012, which claims priority to Japanese Application No. 2011-105721, filed May 10, 2011, the disclosures of which are hereby incorporated by reference in their entirety.

TECHNICAL FIELD

The invention relates to a thin film transistor, a sputtering target, and methods for producing the same.

BACKGROUND ART

In recent years, next-generation displays such as ultra high definition displays (e.g., 8K4K (SHV) and 4K2K), high-frame-rate displays (e.g., 240 Hz (4× frame rate) and 480 Hz (8× frame rate)), and various 3D displays have been extensively developed. The mobility of a display-control thin film transistor (TFT) produced using amorphous silicon is about 0.5 $cm^2$/Vs, which is insufficient for implementing a next generation high-performance liquid crystal display or organic display. Therefore, it is important to improve the performance (mobility) of a TFT in order to implement a next-generation display.

The development of a TFT used for a next-generation display was initiated to achieve a mobility of about 2 to 8 $cm^2$/Vs. However, a mobility of 20 $cm^2$/Vs or more, 25 $cm^2$/Vs or more, or 30 $cm^2$/Vs or more has been desired in recent years (see Non-patent Document 1).

A medium or small-sized display used for a tablet PC, a smartphone, and the like has also been increased in definition, and has been designed to form a peripheral circuit (e.g., driver circuit) on a substrate. A medium or small-sized display has been produced using low-temperature polysilicon (LTPS) when high mobility is required. However, since products to which such a display can be applied are limited due to an increase in cost, a technique that can inexpensively produce a TFT exhibiting a high mobility of about 30 $cm^2$/Vs has been desired (see Non-patent Document 1).

Hosokawa et al. found an n-type semiconductor material that includes indium oxide and zinc oxide (see Patent Document 1), and various oxide films that include indium oxide and zinc oxide have attracted attention as a semiconductor material since then. In particular, since a TFT exhibiting a mobility of about 10 $cm^2$/Vs can be produced using an amorphous oxide film that includes indium oxide, zinc oxide, and gallium oxide, an amorphous oxide film that includes indium oxide, zinc oxide, and gallium oxide has attracted attention as a material that makes it possible to inexpensively produce a TFT having high mobility used for medium or small-sized displays and large-area displays.

It has been studied to form such an oxide film using a physical film-forming technique (e.g., sputtering, pulsed laser deposition (PLD), or evaporation) or a chemical film-forming technique (e.g., sol-gel method). In particular, sputtering has been mainly studied since a film can be uniformly formed over a large area at a relatively low temperature.

It has been mainly studied to produce a TFT using an oxide semiconductor that includes indium oxide, zinc oxide, and gallium oxide so that the atomic ratio "In:Ga:Zn" is 1:1:1 or 2:2:1. However, the mobility of a TFT produced using such an atomic ratio is normally about 10 $cm^2$/Vs, and a TFT exhibiting a high mobility of about 30 $cm^2$V/s that is required for next-generation displays or replacing LTPS has not been produced on an industrial scale.

Attempts have been made to produce a TFT having high mobility by changing the device configuration, the TFT production conditions, and the like. However, such attempts have not been put to practical use due to various problems (e.g., it is difficult to implement production over a large area with high reproducibility due to a small thickness, a small ratio W/L, use of a stacked structure, and use of an insulating film that is not suitable for industrial production, or the off current increases, or the S-factor increases).

Attempts to improve performance by changing the compositional ratio of In, Ga, and Zn have been made by utilizing a co-sputtering method (see Patent Documents 2 and 3 and Non-patent Document 2), or utilizing various oxide targets that differ in composition (see Patent Document 4). However, a practical TFT exhibiting a high mobility of about 30 $cm^2$/Vs that is required for next-generation displays or replacing LTPS has not been obtained.

A sputtering target that includes indium oxide, zinc oxide, and gallium oxide has also been studied, but a TFT exhibiting a high mobility of about 30 $cm^2$/Vs has not yet been obtained (Patent Documents 5 and 6).

A sputtering target formed of an oxide sintered body differs in properties and sintering conditions appropriate for each compositional ratio. Therefore, the properties of a sputtering target and the sintering conditions appropriate for each compositional ratio have been normally studied after finding a promising material or composition. Accordingly, a compositional ratio that can achieve high performance has been searched using a co-sputtering method when improving the performance of a TFT produced using an oxide semiconductor that includes indium oxide, zinc oxide, and gallium oxide (see Patent Documents 2 and 3 and Non-patent Document 2).

However, a TFT exhibiting a high mobility of about 30 $cm^2$/Vs has not yet been obtained even if the compositional ratio is changed using a co-sputtering method.

RELATED-ART DOCUMENT

Patent Document

Patent Document 1: JP-A-2006-114928
Patent Document 2: JP-A-2007-281409
Patent Document 3: JP-A-2009-21536
Patent Document 4: WO2009/075281
Patent Document 5: WO2008/072486
Patent Document 6: WO2009/148154

Non-Patent Document

Non-patent Document 1: Matsueda, International TFT Conference 2010, S6 (pp. 314-317)
Non-patent Document 2: Joon Chul Moon et al., Journal of the Korean Physical Society, Vol. 53, No. 4, October 2008, pp. 2029-2032

SUMMARY OF THE INVENTION

An object of the invention is to provide a thin film transistor that exhibits high mobility, a method for producing the same, and a sputtering target that may be used to produce the thin film transistor.

The inventors of the invention extensively studied the properties of a sputtering target and the production conditions appropriate for each compositional ratio for a long time, studied the TFT production conditions using the sputtering target, and conducted further studies in order to obtain a sputtering target that makes it possible to produce a high-performance TFT. As a result, the inventors developed a sputtering target that makes it possible to produce a TFT exhibiting a high mobility of about 30 cm$^2$/Vs, and a TFT exhibiting a high mobility of about 30 cm$^2$/Vs.

It is possible to produce a TFT exhibiting a high mobility of about 30 cm$^2$/Vs by a method that can be easily applied on an industrial scale as a result of producing a TFT using the sputtering target according to the invention.

Surprisingly, the compositional ratio (atomic ratio) of the elements (atoms) included in the sputtering target according to the invention differs from the optimum compositional ratio that was found using a co-sputtering method (see Patent Document 2). It is considered that such a difference occurs since an oxide film produced by a co-sputtering method used for determining the optimum compositional ratio and an oxide film produced by a parallel plate-type sputtering method that is normally used on an industrial scale differ in structure, quality, and electrical properties.

Specifically, the co-sputtering method differs from the parallel plate-type sputtering method in that the particles are obliquely scattered onto the substrate, and the distance between the substrate and the sputtering target (S-T distance) is long, for example. As a result, the components and the energy of the sputtering particles scattered onto the substrate differ between the co-sputtering method and the parallel plate-type sputtering method. It is considered that the difference in structure, film quality, and TFT characteristics occurs due to the above factors.

It is conjectured that a TFT exhibiting a high mobility of about 30 cm$^2$/Vs has not yet been produced since it has been difficult to find the optimum composition using the co-sputtering method.

Several aspects of the invention provide the following thin film transistor and the like.

1. A thin film transistor including an active layer, and having a field-effect mobility of 25 cm$^2$/Vs or more, the active layer being formed of an oxide that includes In, Ga, and Zn in an atomic ratio that falls within a region 1, a region 2, or a region 3,
   the region 1 being defined by:
   $0.58 \leq \text{In}/(\text{In}+\text{Ga}+\text{Zn}) \leq 0.68$
   $0.15 < \text{Ga}/(\text{In}+\text{Ga}+\text{Zn}) \leq 0.29$,
   the region 2 being defined by:
   $0.45 \leq \text{In}/(\text{In}+\text{Ga}+\text{Zn}) < 0.58$
   $0.09 \leq \text{Ga}/(\text{In}+\text{Ga}+\text{Zn}) < 0.20$, and
   the region 3 being defined by:
   $0.45 \leq \text{In}/(\text{In}+\text{Ga}+\text{Zn}) < 0.58$
   $0.20 \leq \text{Ga}/(\text{In}+\text{Ga}+\text{Zn}) \leq 0.27$.

2. The thin film transistor according to 1, the thin film transistor having a field-effect mobility of 30 cm$^2$V/s or more.

3. A sputtering target including an oxide sintered body that includes In, Ga, and Zn in an atomic ratio that falls within a region 1, a region 2, or a region 3,
   the region 1 being defined by:
   $0.58 \leq \text{In}/(\text{In}+\text{Ga}+\text{Zn}) \leq 0.68$
   $0.15 < \text{Ga}/(\text{In}+\text{Ga}+\text{Zn}) \leq 0.29$,
   the region 2 being defined by:
   $0.45 \leq \text{In}/(\text{In}+\text{Ga}+\text{Zn}) < 0.58$
   $0.09 \leq \text{Ga}/(\text{In}+\text{Ga}+\text{Zn}) < 0.20$, and
   the region 3 being defined by:
   $0.45 \leq \text{In}/(\text{In}+\text{Ga}+\text{Zn}) < 0.58$
   $0.20 \leq \text{Ga}/(\text{In}+\text{Ga}+\text{Zn}) \leq 0.27$.

4. The sputtering target according to 3, wherein the oxide sintered body has a specific resistivity of less than 15 mΩ·cm and a relative density of more than 97%.

5. The sputtering target according to 3 or 4, wherein the oxide sintered body includes In, Ga, and Zn in an atomic ratio that falls within the region 1 and includes a compound having a homologous structure represented by $(\text{InGaO}_3)\text{ZnO}$, and a compound having a bixbyite structure represented by $\text{In}_2\text{O}_3$.

6. The sputtering target according to 3 or 4, wherein the oxide sintered body includes In, Ga, and Zn in an atomic ratio that falls within the region 2, and includes an oxide for which a diffraction peak is observed by X-ray diffraction measurement (Cu—Kα) at an angle (2θ) of 7.0° to 84°, 30.6° to 32.0°, 338° to 35.8°, 53.5° to 56.5°, and 56.5° to 59.5°.

7. The sputtering target according to 3 or 4, wherein the oxide sintered body includes In, Ga, and Zn in an atomic ratio that falls within the region 3, and includes a compound having a homologous structure represented by $(\text{InGaO}_3)\text{ZnO}$.

8. A method for producing the sputtering target according to any one of 3 to 7, the method including:
   heating from 400° C. to 800° C. at 2.5° C./min or less;
   heating from 800° C. to a sintering temperature at 1.0° C./min or less; and
   sintering at a sintering temperature of 1300 to 1450° C. for a sintering time of 6 to 48 hours.

9. A method for producing the thin film transistor according to 1 or 2, the method including producing an oxide thin film using the sputtering target according to any one of 3 to 7.

The aspects of the invention thus provide a thin film transistor that exhibits high mobility, a method for producing the same, and a sputtering target that can be used to produce the thin film transistor.

DESCRIPTION OF EMBODIMENTS

Figure 1:
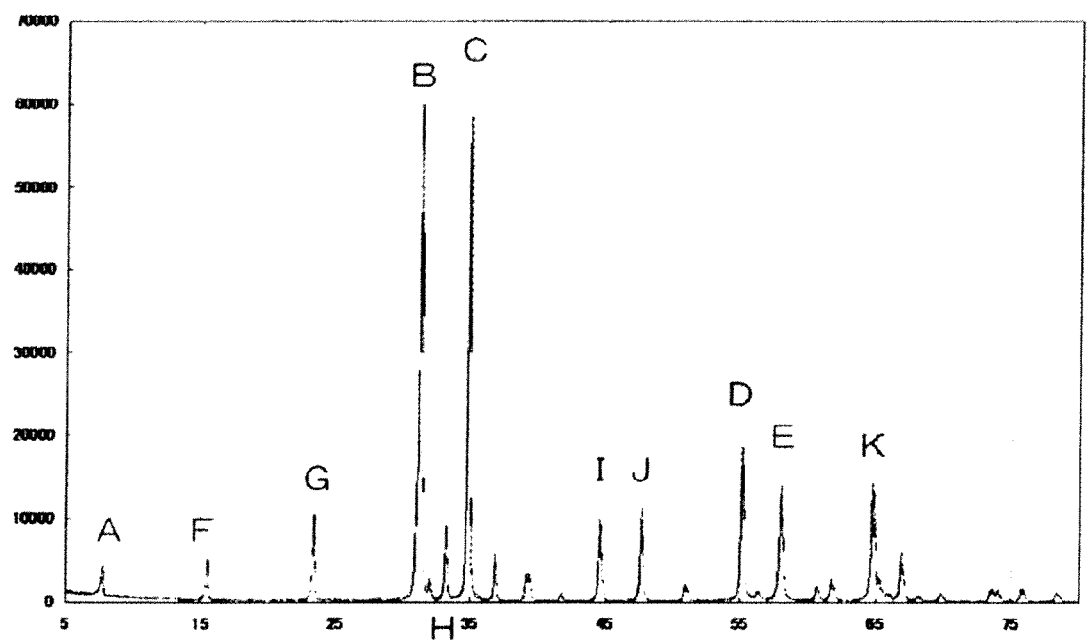
FIG. 1 illustrates the X-ray diffraction chart of the oxide A having peaks in the regions A to K.

The thin film transistor (TFT) according to the invention includes an active layer, the active layer being formed of an oxide that includes In, Ga, and Zn in an atomic ratio (ranges) that falls within the following region 1, region 2, or region 3,
   the region 1 being defined by:
   $0.58 \leq \text{In}/(\text{In}+\text{Ga}+\text{Zn}) \leq 0.68$
   $0.15 < \text{Ga}/(\text{In}+\text{Ga}+\text{Zn}) \leq 0.29$,
   the region 2 being defined by:
   $0.45 \leq \text{In}/(\text{In}+\text{Ga}+\text{Zn}) < 0.58$
   $0.09 \leq \text{Ga}/(\text{In}+\text{Ga}+\text{Zn}) < 0.20$, and
   the region 3 being defined by:
   $0.45 \leq \text{In}/(\text{In}+\text{Ga}+\text{Zn}) < 0.58$
   $0.20 \leq \text{Ga}/(\text{In}+\text{Ga}+\text{Zn}) \leq 0.27$.

The above atomic ratio corresponds to the atomic ratio of the sputtering target described later. The thin film transistor according to the invention has a field-effect mobility of 25 cm$^2$/Vs or more.

The atomic ratio of the elements included in the oxide (active layer) is determined by quantitatively analyzing the elements using an inductively coupled plasma atomic emission spectrometer (ICP-AES).

The details of ICP-AES are described below. When a solution sample is nebulized using a nebulizer, and introduced into an argon plasma (about 6000 to about 8000° C.), each element contained in the sample absorbs thermal energy, and is excited, and the orbital electrons migrate from the ground state to the orbital at a high energy level. The orbital electrons then migrate to the orbital at a lower energy level when about $10^{-7}$ to about $10^{-8}$ seconds has elapsed. In this case, the difference in energy is emitted as light. Since the emitted light has an element-specific wavelength (spectral line), the presence or absence of each element can be determined based on the presence or absence of the spectral line (qualitative analysis).

Since the intensity (luminous intensity) of each spectral line is in proportion to the amount (number) of each element contained in the sample, the element concentration in the sample can be determined by comparison with a standard solution having a known concentration (quantitative analysis).

After specifying the elements contained in the sample by qualitative analysis, the content of each element is determined by quantitative analysis, and the atomic ratio of the elements is calculated from the determination results.

The field-effect mobility of the TFT according to the invention is preferably 25 cm$^2$/Vs or more, more preferably 28 cm$^2$/Vs or more, and particularly preferably 30 cm$^2$/Vs or more.

When the field-effect mobility of the TFT is 25 cm$^2$/Vs or more, a peripheral circuit (e.g., driver circuit) can be formed on a panel within a small area. When the field-effect mobility of the TFT is 30 cm$^2$/Vs or more, the TFT can be further reduced in size, and is expected to be applied to a panel of a mobile device (e.g., smartphone or tablet terminal).

It is preferable that the field-effect mobility be as high as possible. The upper limit of the field-effect mobility is considered to be about 100 cm$^2$/Vs, for example.

Examples of the evaluation criteria for the transistor characteristics other than the field-effect mobility include the threshold voltage (Vth), the on/off ratio, the S-factor, and the like.

The field-effect mobility can be calculated from the characteristics in a linear region and a saturation region. For example, the field-effect mobility in the linear region may be derived by drawing a Id-Vg graph based on the transfer characteristic measurement results, and calculating Vg-transconductance (Gm). Note that Gm is represented by $\partial(Id)/\partial(Vg)$. The field-effect mobility is evaluated by this method unless otherwise indicated. Id is the source-drain current, and Vg is the gate voltage when a voltage Vd is applied between the source electrode and the drain electrode.

The value Vg at Id=$10^{-9}$ A may be used as the threshold voltage in the linear region, for example. The on/off ratio may be determined using the value Id at Vg=−15 V as the off current value, and using the value Id at Vg=20 V as the on current value, for example.

The S-factor may be determined by drawing a log Id-Vg graph, and calculating the ratio $\partial(Vg)/\partial(\log Id)$ from the slope at Id=$10^{-10}$ A to $10^{-9}$ A.

The S-factor of the TFT according to the invention is preferably 0.6 V/decade or less, more preferably 0.5 V/decade or less, and particularly preferably 0.4 V/decade or less. When the S-factor of the TFT is 0.6 V/decade or less, it is expected that the power consumption during drive can be reduced.

The TFT is normally configured so that the source-drain current Id is controlled (on/off) by switching the gate voltage Vg between 0 V and 5 to 20 V when a voltage Vd of about 5 to 20 V is applied between source electrode and the drain electrode.

The transfer characteristics of the TFT are normally measured under the following conditions.
Vg: −15 V to 20 V
Vd: 0.1 V, 1 V, or 10 V The active layer included in the TFT according to the invention may be produced using the sputtering target described below.

The sputtering target includes an oxide sintered body that includes In, Ga, and Zn in an atomic ratio that falls within the following region 1, region 2, or region 3,
the region 1 being defined by:
0.58≤In/(In+Ga+Zn)≤0.68
0.15<Ga/(In+Ga+Zn)≤0.29,
the region 2 being defined by:
0.45≤In/(In+Ga+Zn)<0.58
0.09≤Ga/(In+Ga+Zn)<0.20, and
the region 3 being defined by:
0.45≤In/(In+Ga+Zn)<0.58
0.20≤Ga/(In+Ga+Zn)≤0.27.

When the atomic ratio falls within the region 1, a TFT that ensures high mobility and a particularly small S-factor can be obtained. Since the Ga content is relatively high, it is expected that a TFT that ensures an increase in short-wavelength light transmittance and a reduction in photocurrent can be obtained. Moreover, since the etching rate achieved when using an oxalic acid-based etchant is close to that of an amorphous transparent electrode (e.g., indium zinc oxide or ITO), the process design is facilitated.

It is particularly preferable that the atomic ratio that falls within the region 1 be as shown below.
0.58≤In/(In+Ga+Zn)≤0.65
0.15<Ga/(In+Ga+Zn)≤0.29
0.13≤Zn/(In+Ga+Zn)

When the ratio "In/(In+Ga+Zn)" is less than 0.65, the S-factor can be easily reduced. Moreover, a normally-off operation can be easily implemented. When the ratio "Ga/(In+Ga+Zn)" is more than 0.15, it is expected that an improvement in humidity resistance can be achieved. When the ratio "Zn/(In+Ga+Zn)" is 0.13 or more, the specific resistance of the sintered body can be easily reduced. Moreover, etching is facilitated when producing a TFT, and a residue rarely occurs.

When the atomic ratio falls within the region 2, a TFT that ensures high mobility and a small S-factor can be obtained.

It is particularly preferable that the atomic ratio that falls within the region 2 be as shown below.
0.45≤In/(In+Ga+Zn)<0.58
0.10≤Ga/(In+Ga+Zn)<0.20

When the ratio "In/(In+Ga+Zn)" is 0.45 or more, it is expected that high mobility is obtained.

When the ratio "Ga/(In+Ga+Zn)" is less than 0.20, a normally-off operation can be easily implemented.

When the atomic ratio falls within the region 3, a TFT that ensures a small S-factor can be obtained although the field-effect mobility decreases to some extent as compared with the case where the atomic ratio falls within the region 1 or 2.

It is preferable that the atomic ratio that falls within the region 3 be as shown below.
0.45≤In/(In+Ga+Zn)<0.58
0.20≤Ga/(In+Ga+Zn)≤0.27.

When the ratio "Ga/(In+Ga+Zn)" is less than 0.25, the mobility increases. When the ratio "Ga/(In+Ga+Zn)" is more than 0.20, it is expected that an increase in short-wavelength light transmittance and a reduction in photocurrent can be achieved.

When the ratio "In/(In+Ga+Zn)" is 0.45 or more, it is expected that high mobility is obtained.

It is preferable that the oxide sintered body that forms the sputtering target have an oxygen deficiency. It is preferable that the amount of oxygen deficiency be $1\times10^{-7}$ to $3\times10^{-1}$ times the oxygen atom content calculated from the compositional ratio. When the amount of oxygen deficiency is within the above range, the specific resistivity can be easily reduced.

It is more preferable that the amount of oxygen deficiency of the target (sintered body) be $1\times10^{-7}$ times or more and less than $1\times10^{-3}$ times the stoichiometric ratio of oxygen atoms calculated from the compositional ratio. It is particularly preferable that the amount of oxygen deficiency of the target (sintered body) be less than $5\times10^{-4}$ times the stoichiometric ratio of oxygen atoms calculated from the compositional ratio. When the amount of oxygen deficiency is less than $1\times10^{-3}$ times the stoichiometric ratio of oxygen atoms, since a sufficient amount of activated oxygen is present when forming a semiconductor film, it is expected that the threshold voltage rarely becomes negative.

In order to adjust the amount of oxygen deficiency of the target (sintered body) to a value within the above range, it is preferable to omit a reduction treatment after sintering. It is also preferable to effect sintering in air or an oxygen atmosphere instead of a nitrogen atmosphere.

The amount of oxygen deficiency can be adjusted by appropriately selecting the sintering conditions, the atmosphere during sintering, the atmosphere when increasing the temperature, the atmosphere when decreasing the temperature, and the like. The amount of oxygen deficiency can also be adjusted by performing a reduction treatment after sintering, for example. Note that the amount of oxygen deficiency can be easily adjusted to a value within the above range without performing a reduction treatment after sintering when an In-rich layer is present.

The amount of oxygen deficiency refers to a value (unit: mol) obtained by subtracting the number of oxygen ions included in 1 mol of the oxide crystal from the stoichiometric number of oxygen ions. The number of oxygen ions included in the oxide crystal can be calculated by measuring the amount of carbon dioxide produced when heating the oxide crystal in a carbon powder based on an infrared absorption spectrum, for example. The stoichiometric number of oxygen ions can be calculated from the mass of the oxide crystal.

It is preferable that the number of indium-deficient regions (e.g., $ZnGa_2O_4$ compound) having a diameter of 3 micrometers or more within a 90 micrometer×90 micrometer range of the oxide sintered body be 10 or less, more preferably 5 or less, and particularly preferably 1 or less. Since an indium-deficient region tends to have high resistivity, it is expected that occurrence of an abnormal discharge can be suppressed when the number of indium-deficient regions is small. The number of indium-deficient regions is measured using an electron probe micro analyzer (EPMA).

EPMA may be performed under the following conditions.
System: JXA-8200 (manufactured by JEOL Ltd.)
Measurement conditions: accelerating voltage: 15 kV, irradiation current: 50 nA, irradiation time (per point): 50 ms The oxide sintered body preferably has a nitrogen content of 5 ppm (atomic ppm) or less. If the oxide sintered body has a nitrogen content of more than 5 ppm, an abnormal discharge may occur during sputtering using the resulting target, and the amount of gas adsorbed on the surface of the target may not be sufficiently reduced. Moreover, nitrogen and indium included in the target may react during sputtering to produce black indium nitride (InN), which may be mixed in the semiconductor film to decrease the yield.

The nitrogen content is normally reduced to 5 ppm or less by adjusting the nitrogen partial pressure during sintering to less than 1 atmosphere, preferably 0.8 atmospheres or less, and more preferably 0.5 atmospheres or less. It is particularly preferable to effect sintering in an oxygen atmosphere.

It is preferable that the oxide sintered body have a specific resistivity of less than 15 mΩ·cm and a relative density of more than 97%.

The specific resistivity is more preferably 10 mΩ·cm or less, and particularly preferably 5 mΩ·cm or less. The specific resistivity is normally 0.1 mΩ·cm or more. When the specific resistivity is less than 15 mΩ·cm, the target rarely breaks even during AC sputtering. When the specific resistivity is 10 mΩ·cm or less, the target rarely breaks even during AC sputtering or DC sputtering.

If the specific resistivity is 15 mΩ·cm or more, it is necessary to apply a high voltage when causing a plasma discharge during sputtering, and the fragment components may change (i.e., the film quality may change) during sputtering. The specific resistivity may be measured by the method described in the examples.

The relative density is preferably 98% or more, and particularly preferably 99% or more. The relative density is normally less than 100%. When the relative density is more than 97%, the sputtering rate increases, and the target rarely breaks due to an increase in strength. The relative density may be measured by the method described in the examples.

The sputtering target according to the invention may include a metal element other than In, Ga, and Zn, such as Sn, Ge, Si, Ti, Zr, or Hf as long as the advantageous effects of the invention are not impaired. The metal elements included in the target according to the invention may consist essentially of In, Ga, and Zn. The expression "substantially" means that the sputtering target does not include an additional element other than unavoidable impurities and the like that are included in the raw materials or mixed during the production process or the like.

When the oxide sintered body that forms the sputtering target includes In, Ga, and Zn in an atomic ratio that falls within the region 1, the oxide sintered body preferably includes a compound having a homologous structure represented by $(InGaO_3)ZnO$, and a compound having a bixbyite structure represented by $In_2O_3$.

Whether or not the oxide sintered body includes the homologous structure represented by $(InGaO_3)ZnO$ and the bixbyite structure represented by $In_2O_3$ may be determined by X-ray diffraction measurement (XRD). XRD may be performed using the system and the conditions described below in connection with the examples.

The crystal structure represented by $InGaO_3(ZnO)_m$ (wherein m is an integer from 1 to 20) is $InGaO_3(ZnO)$ when m=1. The crystal structure represented by $InGaO_3(ZnO)_m$ is referred to as "hexagonal layered compound" or "homologous-phase crystal structure", and corresponds to a crystal having a long-period "natural superlattice" structure in which crystal layers of different substances are stacked.

When the crystal period or the thickness of each thin film layer is at a nanometer level, a combination of the chemical composition and the thickness of each layer produces inherent characteristics that differ from the characteristics of a single substance or a mixed crystal in which the layers are uniformly mixed.

The presence or absence of the homologous-phase crystal structure may be determined by determining whether or not the X-ray diffraction pattern measured using a powder obtained by grinding the target, or the X-ray diffraction pattern measured directly from the target, coincides with the X-ray diffraction pattern of the homologous-phase crystal structure estimated from the compositional ratio, for example. Specifically, the presence or absence of the homologous-phase crystal structure may be determined by determining whether or not the above X-ray diffraction pattern coincides with the X-ray diffraction pattern of the homologous-phase crystal structure obtained from the Joint Committee of Powder Diffraction Standards (JCPDS) card. The JCPDS card number of $InGaO_3(ZnO)$ is 38-1104.

The bixbyite structure represented by $In_2O_3$ (or the C-type rare earth oxide crystal structure) is a cubic crystal system having a space group represented by ($T_h^7$, $I_{a3}$), and is also referred to as "$Mn_2O_3(I)$-type oxide crystal structure". The bixbyite structure represented by $In_2O_3$ shows the X-ray diffraction pattern of the JCPDS card No. 6-0416. $Sc_2O_3$, $Y_2O_3$, $Tl_2O_3$, $Pu_2O_3$, $Am_2O_3$, $Cm_2O_3$, $In_2O_3$, and ITO ($In_2O_3$ doped with about 10 wt % or less of Sn) have the above crystal structure (see "*Toumei Douden-Maku no Gijutsu* (Transparent Conductive Film Technology)", edited by The 166th Committee on Photonic and Electronic Oxide. Japan Society for the Promotion of Science, Ohmsha, Ltd.).

The presence or absence of the C-type rare earth oxide crystal structure may be determined by observing whether or not the crystal structure shows the X-ray diffraction pattern of the JCPDS card No. 6-0416.

The C-type rare earth oxide crystal structure is a structure (stoichiometric ratio: $M_2X_3$) in which one of four anions is removed from the fluorite-type crystal structure that is one of the crystal structures of the compound represented by $MX_2$ (M: cation, X: anion). Six anions (normally oxygen in the case of an oxide) are coordinated to the cations, and the remaining two anion sites are empty. The empty anion site is also referred to as "quasi-ion site" (see "*Toumei Douden-Maku no Gijutsu* (Transparent Conductive Film Technology)", edited by The 166th Committee on Photonic and Electronic Oxide, Japan Society for the Promotion of Science, Ohmsha, Ltd.).

The C-type rare earth oxide crystal structure in which six oxygen atoms (anions) are coordinated to the cations has an oxygen octahedron edge-sharing structure. When the crystal structure has an oxygen octahedron edge-sharing structure, the ns-orbitals of the p metal (cation) overlap to form an electron conduction path, so that the effective mass decreases, and high electron mobility is obtained.

The stoichiometric ratio of the C-type rare earth oxide crystal structure may differ from $M_2X_3$ as long as not the crystal structure shows the X-ray diffraction pattern of the JCPDS card No. 6-0416. Specifically, the crystal structure may be represented by $M_2O_{3-d}$.

When the oxide sintered body includes In, Ga, and Zn in an atomic ratio that falls within the region 2, the oxide sintered body preferably includes an oxide (oxide A) for which a diffraction peak is observed by X-ray diffraction measurement (Cu—Kα) in the following regions A to E (angle 2θ) (condition 1).
A. 2θ=7.0° to 8.4° (preferably 7.2° to 82°)
B. 2θ=30.6° to 32.0° (preferably 30.8° to 31.8°)
C. 2θ=33.8° to 35.8° (preferably 34.3° to 35.3°)
D. 2θ=53.5° to 56.5° (preferably 54.1° to 56.1°)
E. 2θ=56.5° to 59.5° (preferably 57.0° to 59.0°)

It is more preferable that the oxide A also satisfy the following condition 2. Condition 2: One of the diffraction peaks observed at an angle 2θ of 30.6° to 32.0° (region B) and an angle 2θ of 33.8° to 35.8° (region C) is a main peak, and the other diffraction peak is a sub-peak. Note that the term "main peak" used herein refers to a peak having the highest intensity (height) within the range in which 2θ=5 to 80°, and the term "sub-peak" used herein refers to a peak having the second highest intensity (height) within the range in which 2θ=5 to 80°.

It is more preferable that the oxide A also satisfy the following condition 3. Condition 3: A diffraction peak is observed in the following regions F to K in a chart obtained by X-ray diffraction measurement (Cu—Kα).
F. 2θ=14.8° to 16.2° (preferably 15.0° to 16.0°)
G. 2θ=22.3° to 24.3° (preferably 22.8° to 23.8°)
H. 2θ=32.2° to 34.2° (preferably 32.7° to 33.7°)
I. 2θ=43.1° to 46.1° (preferably 43.6° to 45.6°)
J. 2θ=46.2° to 49.2° (preferably 46.7° to 48.7°)
K. 2θ=62.7° to 66.7° (preferably 63.7° to 65.7°)

FIG. 1 illustrates an example of the X-ray diffraction chart of the above oxide. In FIG. 1, A to K indicate the peak position (region). Note that the horizontal axis indicates 2θ, and the vertical axis indicates intensity. XRD may be performed using the system and the conditions described below in connection with the examples.

An oxide crystal that satisfies the conditions 1 and 2 is a novel crystal that is not registered in the JCPDS database (cards), and has not been identified.

Figure 2:
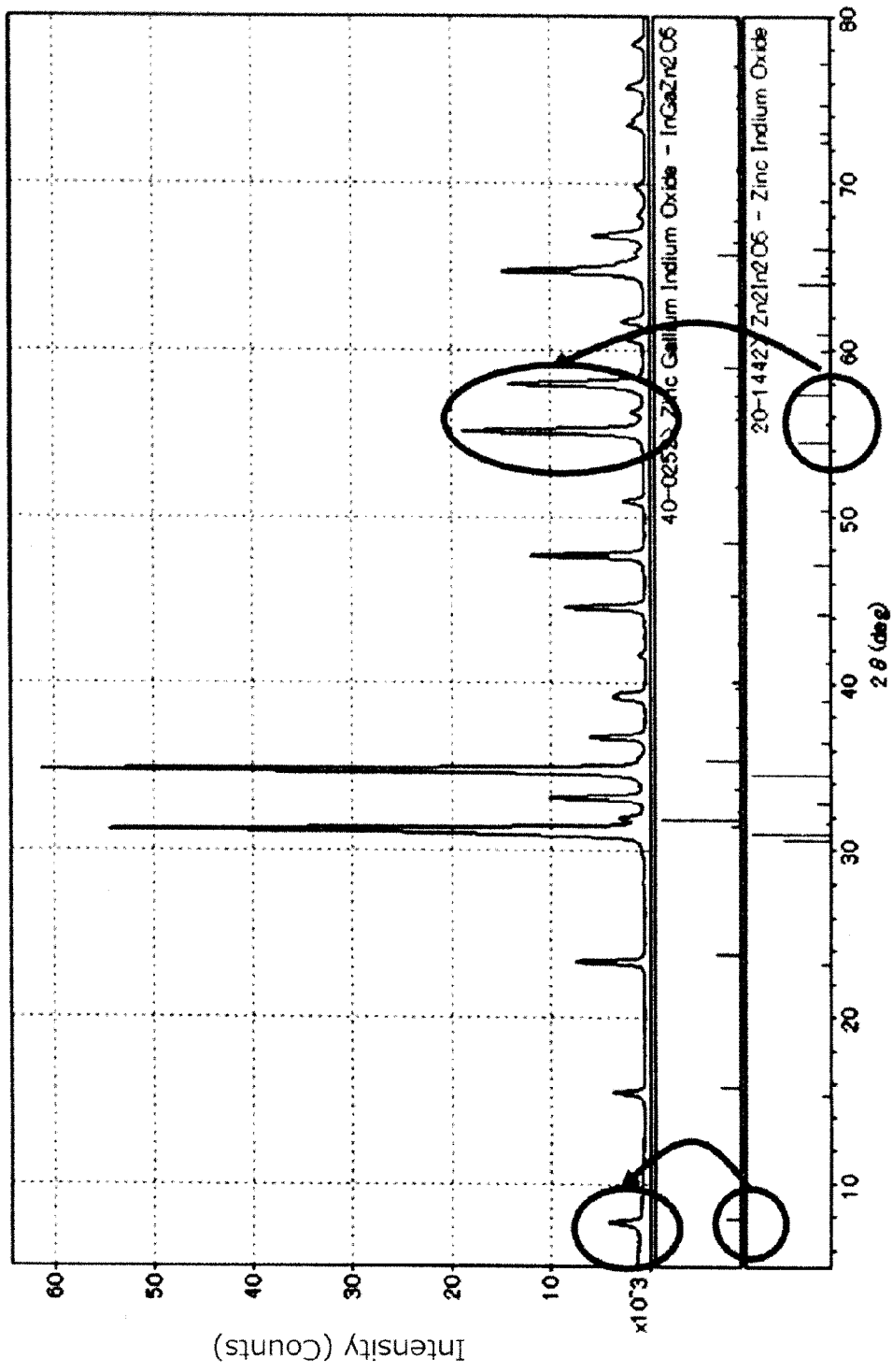
FIG. 2 is a view illustrating the X-ray diffraction charts of the oxide A, the crystal structure represented by $\text{InGaO}_3(\text{ZnO})_2$ (JCPDS: 40-0252), and the crystal structure represented by $\text{In}_2\text{O}_3(\text{ZnO})_2$ (JCPDS: 20-1442).

FIG. 2 illustrates the X-ray diffraction charts of the oxide A, the crystal structure represented by $InGaO_3(ZnO)_2$ (JCPDS: 40-0252), and the crystal structure represented by $In_2O_3(ZnO)_2$ (JCPDS: 20-1442).

The X-ray diffraction chart of the oxide A (crystal) is similar to those of the crystal structure represented by $InGaO_3(ZnO)_2$ (JCPDS: 40-0252) and the crystal structure represented by $In_2O_3(ZnO)_2$ (JCPDS: 20-1442). However, the oxide A has a peak characteristic of $InGaO_3(ZnO)_2$ (i.e., a peak in the region A), and peaks characteristic of $In_2O_3(ZnO)_2$ (i.e., peaks in the regions D and E) (see FIG. 2).

Therefore, it is considered that the oxide A has a novel periodicity differing from those of $InGaO_3(ZnO)_2$ and $In_2O_3(ZnO)_2$. Specifically, the oxide A differs from $InGaO_3(ZnO)_2$ and $In_2O_3(ZnO)_2$.

The peak in the region B is situated between the main peak (at about 31°) of $In_2O_3(ZnO)_2$ and the main peak (at about 32°) of $InGaO_3(ZnO)_2$. Therefore, the peak in the region B is shifted to the low-angle side (i.e., it is considered that the lattice spacing is large) as compared with the main peak of $InGaO_3(ZnO)_2$, and is shifted to the high-angle side (i.e., it is considered that the lattice spacing is small) as compared with the main peak of $In_2O_3(ZnO)_2$.

It is considered that the crystal structure represented by $In_2O_3(ZnO)_m$ has a structure in which an $InO_{1.5}$ layer, an $InZnO_{2.5}$ layer, and a ZnO layer are periodically repeated in a ratio of 1:1:(m−1).

It is considered that the crystal structure represented by $InGaO_3(ZnO)_m$ has a structure in which an $InO_{1.5}$ layer, a $GaZnO_{2.5}$ layer, and a ZnO layer are periodically repeated in a ratio of 1:1:(m−1).

Specifically, the crystal structure represented by $In_2O_3(ZnO)_m$ and the crystal structure represented by $InGaO_3(ZnO)_m$ differ in peak position (lattice spacing), but show a similar X-ray diffraction pattern.

It is considered that the crystal structure of the oxide A corresponds to the hexagonal layered compound or the homologous-phase crystal structure in the same manner as $In_2O_3(ZnO)_m$ and $InGaO_3(ZnO)_m$.

The X-ray diffract on pattern of the crystal structure of the oxide A is particularly similar to that of $In_2O_3(ZnO)_2$. However, it has been known that it is difficult to synthesize an oxide having the crystal structure represented by $In_2O_3(ZnO)_2$ when the material is not fired at a high temperature of more than 1550° C. Since the crystal structure of the oxide A can be obtained through sintering at a low temperature of 1550° C. or less, it is considered that the crystal structure of the oxide A is a novel crystal structure from the viewpoint of the production temperature.

The oxide A may have excess oxygen or an oxygen deficiency (i.e., the atomic ratio of oxygen may differ from the stoichiometric ratio) as long as the oxide A shows its specific diffraction pattern (condition 1 or conditions 1 and 2) when subjected to X-ray diffraction measurement.

When the oxide A has excess oxygen, the resistivity of the resulting target may increase to a large extent. Therefore, it is preferable that the oxide A have an oxygen deficiency.

When the oxide sintered body that forms the sputtering target includes In, Ga, and Zn in an atomic ratio that falls within the region 3, the oxide sintered body preferably includes a compound having a homologous structure represented by $(InGaO_3)ZnO$.

The above sputtering target makes it possible to produce a high-performance TFT (high mobility and low S-factor) by parallel plate-type sputtering that is widely used on an industrial scale.

The method for producing the sputtering target according to the invention described below.

(1) Mixing Step

In a mixing step, the raw materials (metal oxides) for producing the sputtering target are mixed.

Powders such as a powder of an indium compound, a powder of a gallium compound, and a powder of a zinc compound are used as the raw materials. The specific surface area (BET specific surface area) of each metal compound used as the raw material for producing the target may be measured in accordance with JIS Z 8830. Examples of the indium compound include indium oxide, indium hydroxide, and the like. Examples of the gallium compound include gallium oxide, gallium hydroxide, and the like. Examples of the zinc compound include zinc oxide, zinc hydroxide, and the like. An oxide is preferable as the compound of each element due to ease of sintering and suppression of residual by-products.

The purity of each raw material is normally 2N (99 mass %) or more, preferably 3N (99.9 mass %) or more, and particularly preferably 4N (99.99 mass %) or more. If the purity is less than 2N, a deterioration in durability may occur, or burn-in may occur when the material is used for a liquid crystal display due to entrance of impurities into the liquid crystal side.

It is preferable to use zinc metal (zinc powder) as part of the raw material. Occurrence of white spots can be suppressed by utilizing zinc dust as part of the raw material.

It is preferable to homogeneously mix and grind the raw materials (e.g., metal oxides) used to produce the target using a normal mixer/grinder such as a wet ball mill, a bead mill, or an ultrasonic device.

When using a wet ball mill, the raw materials are normally mixed and ground for 0.5 to 60 hours, preferably 6 to 48 hours, and more preferably 8 to 36 hours. If the mixing/pulverizing time is less than 0.5 hours, the raw materials may not be sufficiently dispersed, and a deterioration in appearance (e.g., white spots and dark spots) may occur. If the mixing/grinding time exceeds 60 hours, an unexpected crystal form may be produced due to reactions during mixing.

The specific surface area (BET specific surface area) of indium oxide, gallium oxide, and zinc oxide is normally 3 to 18 $m^2/g$, 3 to 18 $m^2/g$, and 3 to 18 $m^2/g$, preferably 7 to 16 $m^2/g$, 7 to 16 $m^2/g$, and 3 to 10 $m^2/g$, more preferably 7 to 15 $m^2/g$, 7 to 15 $m^2/g$, and 4 to 10 $m^2/g$, and particularly preferably 11 to 15 $m^2/g$, 11 to 15 $m^2/g$, and 4 to 5 $m^2/g$, respectively.

If the specific surface area is too small, aggregates of each element may be formed (grown) in the sintered body, the crystal form of the raw material powder may remain in the sintered body, or an unexpected crystal form may be produced, and a change in properties may occur, for example. If the specific surface area is too large, an unexpected crystal form may be produced, and a change in properties may occur, or inferior external appearance or non-uniform properties may be obtained due to inferior dispersion, for example.

(2) Calcining Step

A calcining step is optionally provided. In the calcining step, a mixture of the compounds used as the raw materials for producing the target is prepared, and than calcined.

The calcining step can easily increase the density, but may increase cost. Therefore, it is preferable that an increase in density be achieved without performing the calcining step.

In the calcining step, it is preferable to heat the mixture of the metal oxides at 500 to 1200° C. for 1 to 100 hours. If the heating temperature is less than 500° C., or the heating time is less than 1 hour, the indium compound, the zinc compound, and the tin compound may not be sufficiently thermally decomposed. If the heating temperature exceeds 1200° C., or the heating time exceeds 100 hours, coarse particles may be produced.

Therefore, it is particularly preferable to heat (calcine) the mixture at 800 to 1200° C. for 2 to 50 hours.

Note that it is preferable to grind the resulting calcined product before the subsequent forming step and firing step.

(3) Forming Step

In the forming step, a mixture of the metal oxides (the calcined product when the calcining step is provided) is compression-formed to obtain a formed body. The mixture is formed by the forming step to have a shape suitable for the target. When the calcining step is provided, a fine powder of the calcined product may be granulated, and compression-formed to have the desired shape.

The mixture may be formed by die forming, cast forming, injection forming, or the like. It is preferable to form the mixture by cold isostatic pressing (CIP), hot isostatic pressing (HIP), or the like in order to obtain a homogeneous sintered body (target) having high sintering density and low specific resistivity. When the mixture is formed by press forming (uniaxial pressing), an unexpected crystal form may be produced due to non-uniform pressure.

A forming aid such as polyvinyl alcohol, methyl cellulose, polywax, or oleic acid may be used when forming the mixture.

The thickness of the formed body is normally 6 mm or more, preferably 8 mm or more, and particularly preferably 10 mm or more. If the thickness of the formed body is less than 6 mm, since the formed body shrinks during sintering to have too small a thickness, the thermal conductivity may become non-uniform, or an unexpected crystal form may be produced, or the crystal grain size may increase to a large extent.

(4) Sintering Step

The sintering step is an indispensable step that fires the formed body obtained by the forming step.

It is preferable to perform the sintering step in an oxygen-contain ng atmosphere, an oxygen gas atmosphere, or a pressurized oxygen gas atmosphere in order to control the nitrogen content and the amount of oxygen deficiency.

The temperature increase rate during sintering is normally 4° C./min or less, and preferably 3° C./min or less. When the temperature increase rate is 4° C./min or less, cracks rarely occur.

It is preferable that the temperature increase rate be 2.5° C./min or less from room temperature to 400° C., 2.5° C./min or less from 400° C. to 800° C., and 1.0° C./min or less from 800° C. to the sintering temperature.

The temperature increase rate from room temperature to 400° C. is more preferably 1.0° C./min or less. When the temperature increase rate from room temperature to 400° C. is 1.0° C./min or less, it is expected that the number of voids in the sintered body can be reduced, and an increase in relative density can be achieved.

The temperature increase rate from 800° C. to the sintering temperature is more preferably 0.9° C./min or less. When the temperature increase rate from 800° C. to the sintering temperature is 0.9° C./min or less, the crystal form according to the invention can be easily produced.

The sintering step is normally performed at 1100 to 1600° C. for 1 to 100 hours. It is preferable to perform the sintering step at 1300 to 1450° C. for 6 to 48 hours.

When the sputtering target has a composition that falls within the region 2, the oxide A can be easily produced by the following sintering method.

Specifically, the temperature is increased from 400° C. to 1000° C. at 2.5° C./min or less, and sintering is effected at 1350 to 1400° C. for 20 to 48 hours, or the temperature is increased from 400° C. to 1000° C. at 2.5° C./min or less, and sintering is effected at 1400 to 1490° C. for 6 to 20 hours, or the temperature is increased from 400° C. to 1000° C. at 2.5° C./min or less, and sintering is effected at 1490 to 1650° C. for 2 to 6 hours.

It is preferable to increase the temperature from 800° C. to the sintering temperature at 1.0° C./min or less, set the sintering temperature to 1350 to 1500° C., and set the sintering time to 6 to 24 hours.

The temperature decrease rate during sintering is normally 4° C./min or less, preferably 2° C./min or less, more preferably 1° C./min or less, still more preferably 0.8° C./min or less, and particularly preferably 0.5° C./min or less. When the temperature decrease rate is 4° C./min or less, the crystal form according to the invention can be easily produced. Moreover, cracks rarely occur when decreasing the temperature.

The sintering step may be performed in two or more stages by stopping the temperature increase operation when increasing the temperature, and maintaining the holding temperature.

Note that the lower limit of the temperature increase rate and the lower limit of the temperature decrease rate during sintering are not particularly limited, but are preferably 0.1° C./min or more taking account of the productivity. If the temperature increase rate and the temperature decrease rate are 0.1° C./min or less, the sintering time may exceed 500 hours during production, and the productivity may deteriorate. Moreover, it may be difficult to control the sintering process.

(5) Reduction Step

A reduction step is optionally provided. In the reduction step, a reduction treatment is performed so that the sintered body obtained by the sintering step has a reduced bulk resistivity over the entire target.

Examples of a reduction method that may be used in the reduction step include reduction using a reducing gas, reduction using vacuum firing or an inert gas, and the like.

When employing reduction using a reducing gas, hydrogen, methane, carbon monoxide, a mixture of such a gas and oxygen, or the like may be used.

When employing reduction by firing in an inert gas, nitrogen, argon, a mixture of such a gas and oxygen, or the like may be used.

Note that is preferable to omit the reduction treatment after sintering when it is desired to adjust the amount of oxygen deficiency of the target (sintered body) to a value equal to or less than a given value.

(6) Processing Step

A processing step is optionally provided. In the processing step, the sintered body obtained by sintering is cut to have a shape suitable for installation in a sputtering apparatus, and for bonding to a jig (e.g., backing plate).

The thickness of the sintered body before grinding is preferably 5.5 mm or more, more preferably 6 mm or more, and particularly preferably 8 mm or more. Each side of the sintered body is normally ground by 0.2 mm or more, preferably 0.5 mm or more, and more preferably 2 mm or more. A homogeneous target can be produced by producing a sintered body having a large thickness, and sufficiently grinding the sintered body.

When producing a sputtering target (material) using the oxide sintered body, the oxide sintered body is ground using a surface grinder to have a surface roughness (Ra) of 5 micrometers or less, for example. The sputter ng side of the sputtering target may be mirror-finished to have an average surface roughness (Ra) of 1000 Å or less. The sputtering target may be mirror-finished (polished) by a known polishing technique such as mechanical polishing, chemical polishing, or mechanochemical polishing (i.e., a combination of mechanical polishing and chemical polishing). For example, the sputtering target may be polished (#2000 or more) using a fixed abrasive polisher (polishing liquid: water), or may be lapped using a free abrasive lap (polishing agent: SiC paste or the like), and then lapped using a diamond paste. The polishing method is not particularly limited.

The resulting sputtering target (material) is bonded to a backing plate. The thickness of the target is normally 2 to 20 mm, preferably 3 to 12 mm, and particularly preferably 4 to 10 mm. A plurality of targets may be bonded to a single backing plate, and may be used as a single target. The surface of the target is preferably finished using a #200 to #10,000 diamond wheel, and particularly preferably #400 to #5000 diamond wheel. If a diamond wheel having a grit number smaller than #200 or larger than #10,000 is used, the target may easily break.

It is preferable that the target have a surface roughness (Ra) of 0.5 micrometers or less, and have a ground surface showing no directivity. If the surface roughness (Ra) is more than 0.5 micrometers, or the ground surface shows directivity, an abnormal discharge may occur, or particles may be produced.

The target may be cleaned by blowing air, or may be cleaned using running water, for example. When removing foreign matter by blowing air foreign matter can be more effectively removed by sucking air using a dust collector from the side opposite to the nozzle. Note that the target may be further cleaned by ultrasonic cleaning or the like since the above cleaning method has a limitation. When using ultrasonic cleaning, it is effective to produce ultrasonic waves at a frequency of 25 to 300 KHz. For example, it is preferable to perform ultrasonic cleaning while producing twelve types of ultrasonic waves at intervals of 25 KHz within a frequency range of 25 to 300 KHz.

Each layer included in the TFT according to the invention is described below.

A material for forming the substrate is not particularly limited. A known material may be used. For example, a glass substrate (e.g., alkali silicate glass, non-alkali glass, or quartz glass), a silicon substrate, a resin substrate (e.g., acrylic resin, polycarbonate, or polyethylene naphthalate (PEN)), a polymer film substrate (e.g., polyethylene terephthalate (PET) or polyamide), or the like may be used.

It is preferable that the semiconductor layer (also referred to as "channel layer" or "active layer") be an amorphous film. When the semiconductor layer is an amorphous film, the semiconductor layer exhibits improved adhesion to an insulating film and a protective layer, and uniform transistor characteristics can be easily obtained even if the transistor has a large area. Note that whether or not the semiconductor layer is an amorphous film may be determined by X-ray crystal structure analysis. The semiconductor layer is amorphous when a clear peak is not observed.

The thickness of the semiconductor layer is normally 5 to 200 nm, preferably 20 to 150 nm, and still more preferably 30 to 100 nm. When the thickness of the semiconductor layer is 5 nm or more, it is expected that the reproducibility of the characteristics can be obtained. When the thickness of the semiconductor layer is 200 nm or less, the semiconductor layer can be produced within the takt time (i.e., the time required for one step per substrate) that can be economically employed when producing a large display. It is particularly preferable that the thickness of the semiconductor layer be 100 nm or less in order to obtain high mobility. When forming the semiconductor layer on a large substrate having a diameter of more than 2 m (e.g., when producing a large liquid crystal display), it is particularly preferable that the thickness of the semiconductor layer be more than 30 nm in order to ensure in-plane uniformity.

The channel length (L) is preferably 1 to 50 micrometers, more preferably 3 to 40 micrometers, and particularly preferably 5 to 25 micrometers. If the channel length (L) exceeds 50 micrometers, the size of the transistor may increase to a large extent, and the degree of integration may decrease. If the channel length (L) is less than 1 micrometer, high accuracy may be required for photolithography, and it may be difficult to employ such a transistor for a large-area display or the like.

The channel width (W) is preferably 1 to 500 micrometers, more preferably 3 to 100 micrometers, and particularly preferably 5 to 50 micrometers. If the channel width (W) exceeds 500 micrometers, the size of the transistor may increase to a large extent, and the degree of integration may decrease. If the channel width (W) is less than 1 micrometer, high accuracy may be required for photolithography, and it may be difficult to employ such a transistor for a large-area display or the like.

The ratio (W/L) of the channel width (W) to the channel length (L) is normally 0.1 to 10, and preferably 0.5 to 5. When the ratio (W/L) is within the above range, the panel design is facilitated.

The TFT according to the invention may include a protective layer for the channel layer.

A material for forming the protective layer for the channel layer is not particularly limited. A material normally used to form the protective layer may be arbitrarily selected as long as the advantageous effects of the invention are not impaired. For example, $SiO_2$, $SiN_x$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTiO_4$, $BaTa_2O_6$, $SrTiO_3$, $AlN$ or the like may be used to form the protective layer.

Among these, it is preferable to use $SiO_2$, $SiN_x$, $Al_2O_3$, $Y_2O_3$, $Hf_2O_3$, or $CaHfO_3$, more preferably $SiO_2$, $SiN_x$, $Y_2O_3$, $Hf_2O_3$, or $CaHfO_3$, and particularly preferably $SiO_2$, $Y_2O_3$, $Hf_2O_3$, or $CaHfO_3$. The number of oxygen atoms of these oxides need not necessarily coincide with the stoichiometric ratio (e.g., either $SiO_2$ or $SiO_x$ may be used). $SiN_x$ may include hydrogen.

The protective film may have a structure in which two or more different insulating films are stacked.

The gate insulating film is normally formed of a dielectric material having a relative permittivity of 2 to 10. When the relative permittivity of the gate insulating film is 2 or more, it is possible to produce a TFT that exhibits high mobility. When the relative permittivity of the gate insulating film is 10 or less, it is expected that a TFT having small hysteresis can be obtained. The relative permittivity of the gate insulating film is preferably 25 to 10, and more preferably 3 to 6. The relative permittivity of the gate insulating film may be measured using a permittivity measurement system.

The relative permittivity (dielectric constant) is the ratio $\in/\in_0=\in r$ of the permittivity of a medium to the vacuum permittivity. The relative permittivity is a dimensionless number, and is constant regardless of the unit system.

$SiO_2$, $SiN_x$, $SiON$, $Al_2O_3$, and the like are preferable as a dielectric material having a relative permittivity of 2 to 9 from the viewpoint of industrial usage and ease of application over a large area. In particular, $SiO_2$ and $SiN_x$ are preferable from the viewpoint of ease of application to a display. Note that the number of oxygen atoms of the oxides used as the dielectric material need not necessarily coincide with the stoichiometric ratio (e.g., either $SiO_2$ or $SiO_x$ may be used). $SiN_x$ may include hydrogen.

The gate insulating film may have a structure in which two or more different insulating films are stacked.

The gate insulating film may be crystalline, polycrystalline, or amorphous. It is preferable that the gate insulating film be polycrystalline or amorphous from the viewpoint of ease of industrial production.

The gate insulating film may be formed using a dielectric material having a relative permittivity of 2 to 9 as described below. For example, when using a silicon substrate, the silicon substrate may be subjected to thermal oxidation so that the surface of the silicon substrate forms a thermal oxide film (layer) formed of $SiO_x$. When using a substrate other than a silicon substrate. $SiN_x$ and/or $SiO_x$ may be formed using a plasma-enhanced chemical vapor deposition (PECVD) apparatus to form the gate insulating film.

An $SiO_x$ film, an $SiN_x$ film, and a stacked film or a mixed film thereof are preferable as the gate insulating film since these films have been used for large-area applications on an industrial scale, and can be inexpensively and uniformly formed.

A material for forming each electrode (i.e., gate electrode, source electrode, and drain electrode) is not particularly limited. A material normally used to form each electrode may be arbitrarily selected as long as the advantageous effects of the invention are not impaired.

For example, a transparent electrode (e.g., indium tin oxide (ITO), indium zinc oxide. ZnO, or $SnO_2$), a metal electrode (e.g., Al, Ag, Cr, Ni, Mo, Au, Ti, Ta, or Cu), or a metal electrode formed of an alloy of the above element may be used.

The method for producing the TFT according to the invention is described below.

Each constituent member (layer) of the TFT may be formed by a known method.

A chemical film-forming method (e.g., spraying, dipping, or CVD) or a physical film-forming method (e.g., sputtering, vacuum deposition, ion plating, or pulsed laser deposition) may be used as the film-forming method.

It is preferable to use a physical film-forming method since the carrier density can be easily controlled, and the quality of the film can be easily improved. It is more preferable to use a sputtering method since high productivity is achieved.

The resulting film may be patterned by various etching methods.

The channel layer (semiconductor layer) of the TFT according to the invention is preferably formed by DC or AC sputtering using the sputtering target according to the invention. DC or AC sputtering makes it possible to reduce damage that may occur when forming the film as compared with RF sputtering. Therefore, it is expected that an improvement in mobility of the resulting TFT and the like can be achieved.

Since low specific resistivity and high density can be obtained using the target according to the invention, a problem such as occurrence of cracks rarely occurs even when forming the film by DC or AC sputtering.

When forming the channel layer, it is preferable to perform a channel layer oxidation treatment. The oxidation treatment may be implemented by the following means.

The partial pressure of oxygen during sputtering is set to 0.1 Pa or more.

A heat treatment (oxygen annealing) is performed at 150 to 400° C. for 0.2 to 5 hours in an oxygen atmosphere at a pressure of 0.1 to 10 Pa.

The film is formed in an oxygen plasma atmosphere (oxygen plasma treatment).

It is preferable to perform a heat treatment at 70 to 350° C. after forming the channel layer (semiconductor layer) and the protective layer for the channel layer (semiconductor layer) on the substrate. If the heat treatment temperature is less than 70° C., a deterioration in thermal stability or heat resistance of the resulting transistor, a decrease in mobility, an increase in S-factor, or an increase in threshold voltage may occur. If the heat treatment temperature exceeds 350° C., it may be difficult to use a substrate that has low heat resistance. Moreover, the equipment cost for the heat treatment may increase.

It is preferable to perform the heat treatment in an inert gas or in the presence of oxygen. In particular, a normally-off TFT can be produced even if the partial pressure of oxygen during sputtering is low by performing the heat treatment in a pressurized oxygen atmosphere in which the partial pressure of oxygen is equal to or more than 1 atmosphere.

It is expected that in-plane uniformity can be improved by performing the heat treatment after forming the protective film on the semiconductor film.

EXAMPLES

Example 1

(1) Production of Oxide Sintered Body $In_2O_3$ (manufactured by Nippon Rare Metal, Inc., purity: 4N, BET surface area: 15 $m^2/g$), $Ga_2O_3$ (manufactured by Nippon Rare Metal, Inc., purity: 4N, BET surface area: 15 $m^2/g$), and ZnO (manufactured by Kojundo Chemical Lab. Co., Ltd., purity: 4N, BET surface area: 4 $m^2/g$) were used as raw materials for producing a sintered body.

The raw materials were weighed so that the atomic ratio "In:Ga:Zn" was 60:20:20, and mixed and ground using a ball mill. The ground raw materials were allowed to dry, and granulated. The granulated powder was subjected to CIP (cold isostatic pressing) to obtain a formed body.

The formed body was sintered under the following conditions.
Sintering atmosphere: oxygen
Temperature increase rate (from room temperature to 400° C.): 0.5° C./min
Temperature increase rate (from 400° C. to transition temperature): 1.0° C./min
Transition temperature: 800° C.
Temperature increase rate (from transition temperature to sintering temperature): 0.3° C./min
Sintering temperature: 1400° C.
Sintering time: 24 hours
Cooling rate (temperature decrease rate) (from sintering temperature to room temperature): 0.3° C./min A heat treatment (post-treatment) under reducing conditions was not performed. Each side of the sintered body having a thickness of 8 mm was ground/polished to have a thickness of 6 mm to obtain a target material having a diameter of 2 inches.

(2) Evaluation of Target Sintered Body

The resulting target sintered body was evaluated as described below. The results are shown in Table 1.
Elemental ratio (atomic ratio): The elemental ratio (atomic ratio) was determined using an inductively coupled plasma atomic emission spectrometer (ICP-AES).
X-ray diffraction measurement (XRD): The surface of the target sintered body was subjected directly to X-ray diffraction measurement (XRD) under the following conditions.
System: "Ultima-III" manufactured by Rigaku Corporation
X-rays: Cu—Kα(wavelength: 1.5406 Å, monochromatized using a graphite monochromator)
2θ-θ reflection method, continuous scan (1.0°/min)
Sampling interval: 0.02°
Slit DS, SS: 2/3°, RS: 0.6 mm
Resistivity (specific resistivity): The resistivity was measured in an arbitrary ten areas by a four-probe method (JIS R 1637) using a resistivity meter ("Loresta" manufactured by Mitsubishi Chemical Corporation), and the average value was taken as the resistivity (specific resistivity).
Relative density: The relative density was calculated by the following expression from the theoretical density calculated from the density of the raw material powder and the density of the sintered body measured by the Archimedes' method.
Relative density (%)=(density measured by Archimedes' method)÷(theoretical density)×100

The nitrogen content in the sintered body was measured using a total nitrogen analyzer (TN analyzer). The nitrogen content in the sintered body was found to be 5 ppm or less.

The total nitrogen analyzer (TN analyzer) is used for elemental analysis of the nitrogen (N) content or the nitrogen (N) content and the carbon (C) content. The total nitrogen analyzer (TN analyzer) decomposes a nitrogen-containing inorganic substance or a nitrogen-containing organic substance in the presence of a catalyst so that nitrogen (N) is converted into nitrogen monoxide (NO). The NO gas is subjected to a gas-phase reaction with ozone, and light is emitted by chemiluminescence. The nitrogen (N) content is quantitatively determined from the luminous intensity.

The surface of the sintered body was cleaned by blowing air, and the subjected to ultrasonic cleaning for 3 minutes. The sintered body was then bonded to a backing plate made of oxygen-free copper using indium solder to obtain a target.

(3) Production of Thin Film Transistor (TFT)

A top-contact/bottom-gate-type TFT was produced by the following method using the resulting sputtering target, and evaluated as described below.

An n-type highly doped silicon substrate provided with a thermal oxide film was used as the substrate. The substrate was used as the gate electrode, and the thermal oxide film ($SiO_2$ insulating film) (100 nm) was used as the gate insulating film.

After providing a mask for forming a channel layer on the silicon substrate, a film was formed by DC sputtering using the target produced in (1) under the conditions shown in Table 1 to form a semiconductor film (channel layer) having a thickness of 50 nm. A heat treatment was then performed at 300° C. for 60 minutes in air.

After providing a mask for forming a source electrode and a drain electrode, an Au film was formed by RF sputtering to form a source electrode and a drain electrode. A heat treatment was then performed at 300° C. for 60 minutes in air to obtain a transistor having a channel length of 100 micrometers and a channel width of 2000 micrometers.

(4) Evaluation of TFT

The elemental ratio (atomic ratio) of the channel layer was determined by ICP-AES.

The transfer characteristics of the TFT were measured using a semiconductor parameter analyzer ("4200SCS" manufactured by Keithley) and a manual prober ("EP-6" or "PM-5" manufactured by SUSS MicroTec) to evaluate the mobility (field-effect mobility) (μ) and the S-factor.

The TFT was heated at 110° C. on a hot plate until just before the measurement in order to reduce the effects of water vapor in air on the TFT. After blowing nitrogen to the TFT for 2 minutes or more in a state in which the TFT was mounted on the prober, the TFT was subjected to the measurement at room temperature in a shading environment.

The transfer characteristics were measured under the following conditions. The results are shown in Table 1.
Vg: −15 V to 20 V
Vd: 0.1 V, 1 V, or 10 V
Measuring Speed: FAST Examples 2 to 13 and Comparative Examples 1 and 2

A target was produced and evaluated, and a TFT was produced and evaluated in the same manner as in Example 1, except that the atomic ratio of the target was changed as shown in Table 1. The nitrogen content in the sintered body (target) was 5 ppm or less. The results are shown in Table 1.

Comparative Examples 3 to 5

An oxide film (active layer) was formed by RF co-sputtering using three targets ($In_2O_3$, ZnO, and $Ga_2O_3$) while adjusting the power applied to each cathode so that the atomic ratio shown in Table 2 was achieved, and a TFT was produced under the conditions shown in Table 2, and evaluated. The remaining operation was performed in the same manner as in Example 1. The results are shown in Table 2.

Example 14

Figure 3:
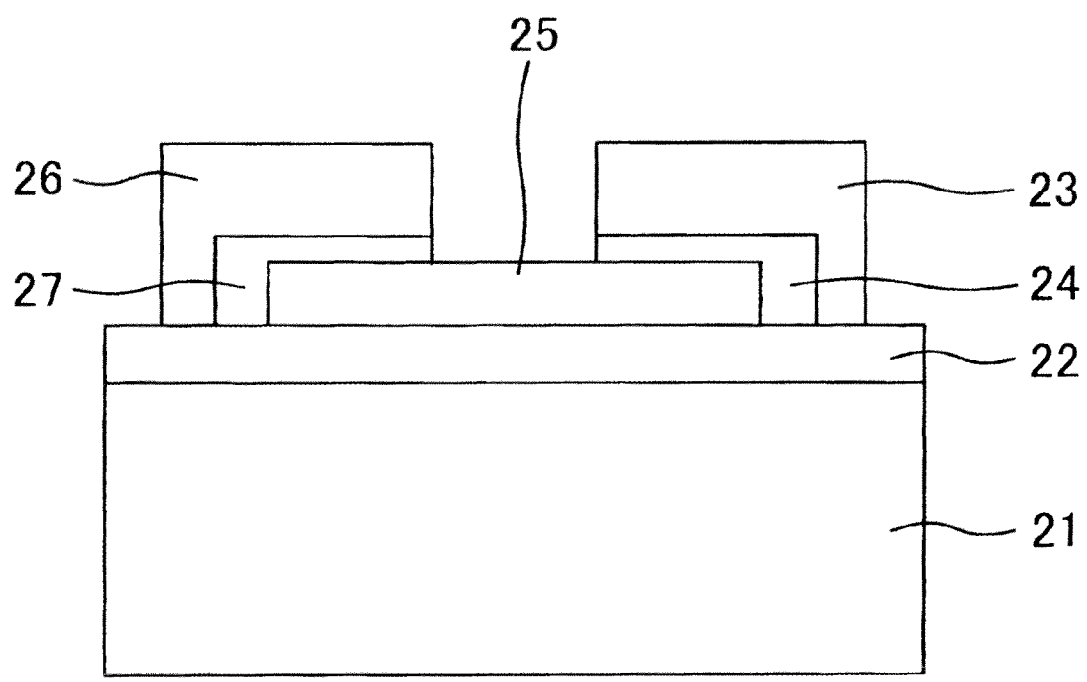
FIG. 3 is a view illustrating the device structure of the TFT produced in Example 14.

A bottom-gate/top-contact-type TFT was produced by the following method using the sputtering target produced in Example 1, and evaluated. FIG. 3 illustrates the device structure of the bottom-gate/top-contact-type TFT.

Specifically, an oxide film 25 was formed on an Si substrate 21 provided with a thermal oxide film 22 using the above sputtering target, and a patterning step, an electrode-forming step, and the like were performed to obtain a device.

The device had a bottom-gate/top-contact-type structure. n+-Si was used for a gate electrode 21, $SiO_2$ was used for an insulating film 22, and a laminate of Ti (23 or 26) and Au (24 or 27) was used for a source drain electrode and a drain electrode (24, 27, 23, 26). The channel width was 150 micrometers, the channel length was 10 micrometers, and the thickness of the active layer 25 was 40 nm.

The resulting TFT was evaluated in the same manner as in Example 1. The results are shown in Table 2.

Example 15

A TFT was produced and evaluated in the same manner as in Example 14, except that the target produced in Example 8 was used. The results are shown in Table 2.

Example 16

A TFT was produced and evaluated in the same manner as in Example 14, except that the target produced in Example 12 was used. The results are shown in Table 2

Example 17

A transistor having a channel length of 20 micrometers and a channel width of 10 micrometers was obtained by photolithography (lift-off) using the target produced in Example 1 (gate insulating film: $SiO_2$, source electrode and drain electrode: Ti/Au, protective film: 100 nm $SiO_2$ formed by PECVD). The TFT was evaluated in the same manner as in Example 1. The results are shown in Table 2.

Example 18

A TFT was produced and evaluated in the same manner as in Example 17, except that the partial pressure of oxygen was reduced, and an oxidation treatment by high-pressure oxygen annealing was performed after producing the TFT at 250° C. and 10 atmospheres for 1 hour in an oxygen atmosphere. The results are shown in Table 2.

TABLE 1

| | | | Example | | | | | | | |
|---|---|---|---|---|---|---|---|---|---|---|
| | | | 1 | 2 | 3 | 4 | 5 | 6 | 7 | 8 |
| Production of target | Mixing Granulation | Mixing method | Ball mill | Ball mill | Ball mill | Ball mill | Ball mill | Ball mill | Ball mill | Ball mill |
| | | Granulation method | Natural drying | Natural drying | Natural drying | Natural drying | Natural drying | Natural drying | Natural drying | Natural drying |
| | Sintering | Sintering atmosphere | Oxygen | Oxygen | Oxygen | Oxygen | Oxygen | Oxygen | Oxygen | Oxygen |
| | | Temperature increase rate (° C./min) (room temperature to 400° C.) | 0.5 | 0.5 | 0.5 | 0.5 | 0.5 | 0.5 | 0.5 | 0.5 |
| | | Temperature increase rate (° C./min) (400° C. to transition temperature) | 1.0 | 1.0 | 1.0 | 1.0 | 1.0 | 1.0 | 1.0 | 1.0 |

TABLE 1-continued

|  |  |  |  |  |  |  |  |  |  |  |
|---|---|---|---|---|---|---|---|---|---|---|
|  |  | Transition temperature (° C.) | 800 | 800 | 800 | 800 | 800 | 800 | 800 | 800 |
|  |  | Temperature increase rate (° C./min) (transition temperature to sintering temperature) | 0.3 | 0.3 | 0.3 | 0.3 | 0.3 | 0.3 | 0.3 | 0.3 |
|  |  | Sintering temperature (° C.) | 1400 | 1400 | 1400 | 1400 | 1400 | 1400 | 1400 | 1400 |
|  |  | Sintering time (Hr) | 24 | 24 | 24 | 24 | 24 | 24 | 24 | 24 |
|  |  | Cooling rate (° C./min) (Sintering temperature to room temperature) | 0.3 | 0.3 | 0.3 | 0.3 | 0.3 | 0.3 | 0.3 | 0.3 |
|  | Grinding | Thickness before grinding (mm) | 8.0 | 8.0 | 8.0 | 8.0 | 8.0 | 8.0 | 8.0 | 8.0 |
|  |  | Thickness after grinding (mm) | 6.0 | 6.0 | 6.0 | 6.0 | 6.0 | 6.0 | 6.0 | 6.0 |
|  |  | Removal depth from surface (mm) | 1.0 | 1.0 | 1.0 | 1.0 | 1.0 | 1.0 | 1.0 | 1.0 |
| Evaluation of sintered body (target) | Compositional ratio (atomic ratio) | In/(In + Ga + Zn) | 0.60 | 0.60 | 0.60 | 0.64 | 0.64 | 0.60 | 0.60 | 0.50 |
|  |  | Ga/(In + Ga + Zn) | 0.20 | 0.16 | 0.24 | 0.20 | 0.16 | 0.26 | 0.29 | 0.10 |
|  |  | Zn/(In + Ga + Zn) | 0.20 | 0.24 | 0.16 | 0.16 | 0.20 | 0.14 | 0.11 | 0.40 |
|  | X-ray diffraction measurement | $In_2O_3$ | ○ | ○ | ○ | ○ | ○ | ○ | ○ | ○ |
|  |  | $ZnGa_2O_4$ |  |  |  |  |  |  |  |  |
|  |  | $In_2Ga_2ZnO_7$ |  |  |  |  |  | ○ | ○ |  |
|  |  | $InGaZnO_4$ | ○ | ○ | ○ | ○ | ○ | ○ | ○ |  |
|  |  | $In_2O_3(ZnO)_2$ |  |  |  |  |  |  |  | ○ |
|  |  | Oxide A Other |  |  |  |  |  |  |  |  |
|  | Specific resistivity (mΩ · cm) |  | 3 | 3 | 3 | 3 | 3 | 3 | 3 | 3 |
|  | Relative density (%) |  | 98 | 98 | 98 | 98 | 98 | 98 | 98 | 98 |
| Production of TFT | Film-forming conditions | Method | DC | DC | DC | DC | DC | DC | DC | DC |
|  |  | Total pressure (Pa) | 0.6 | 0.6 | 0.6 | 0.6 | 0.6 | 0.6 | 0.6 | 0.6 |
|  |  | Partial pressure of oxygen (Pa) | 0.2 | 0.2 | 0.2 | 0.2 | 0.2 | 0.2 | 0.2 | 0.2 |
|  |  | Ultimate pressure (Pa) | $<10^{-4}$ | $<10^{-4}$ | $<10^{-4}$ | $<10^{-4}$ | $<10^{-4}$ | $<10^{-4}$ | $<10^{-4}$ | $<10^{-4}$ |
| Evaluation of TFT | Compositional ratio (atomic ratio) of active layer | In/(In + Ga + Zn) | 0.60 | 0.60 | 0.60 | 0.64 | 0.64 | 0.60 | 0.60 | 0.50 |
|  |  | Ga/(In + Ga + Zn) | 0.20 | 0.16 | 0.24 | 0.20 | 0.16 | 0.26 | 0.29 | 0.10 |
|  |  | Zn/(In + Ga + Zn) | 0.20 | 0.24 | 0.16 | 0.16 | 0.20 | 0.14 | 0.11 | 0.40 |
|  | Field-effect mobility (cm$^2$/Vs) |  | 36 | 37 | 35 | 37 | 38 | 32 | 28 | 33 |
|  | S-factor |  | 0.3 | 0.3 | 0.3 | 0.3 | 0.3 | 0.3 | 0.3 | 0.4 |

|  |  |  | Example | | | | | Comparative Example | |
|---|---|---|---|---|---|---|---|---|---|
|  |  |  | 9 | 10 | 11 | 12 | 13 | 1 | 2 |
| Production of target | Mixing | Mixing method | Ball mill | Ball mill | Ball mill | Ball mill | Ball mill | Ball mill | Ball mill |
|  | Granulation | Granulation method | Natural drying | Natural drying | Natural drying | Natural drying | Natural drying | Natural drying | Natural drying |
|  | Sintering | Sintering atmosphere | Oxygen | Oxygen | Oxygen | Oxygen | Oxygen | Oxygen | Oxygen |
|  |  | Temperature increase rate (° C./min) (room temperature to 400° C.) | 0.5 | 0.5 | 0.5 | 0.5 | 0.5 | 0.5 | 0.5 |
|  |  | Temperature increase rate (° C./min) (400° C. to transition temperature) | 1.0 | 1.0 | 1.0 | 1.0 | 1.0 | 1.0 | 1.0 |
|  |  | Transition temperature (° C.) | 800 | 800 | 800 | 800 | 800 | 800 | 800 |
|  |  | Temperature increase rate (° C./min) (transition temperature to sintering temperature) | 0.3 | 0.3 | 0.3 | 0.3 | 0.3 | 0.3 | 0.3 |

TABLE 1-continued

|  |  |  |  |  |  |  |  |  |  |
|---|---|---|---|---|---|---|---|---|---|
|  |  | Sintering temperature (° C.) | 1400 | 1400 | 1400 | 1400 | 1400 | 1400 | 1400 |
|  |  | Sintering time (Hr) | 24 | 24 | 24 | 24 | 24 | 24 | 24 |
|  |  | Cooling rate (° C./min) (Sintering temperature to room temperature) | 0.3 | 0.3 | 0.3 | 0.3 | 0.3 | 0.3 | 0.3 |
|  | Grinding | Thickness before grinding (mm) | 8.0 | 8.0 | 8.0 | 8.0 | 8.0 | 8.0 | 8.0 |
|  |  | Thickness after grinding (mm) | 6.0 | 6.0 | 6.0 | 6.0 | 6.0 | 6.0 | 6.0 |
|  |  | Removal depth from surface (mm) | 1.0 | 1.0 | 1.0 | 1.0 | 1.0 | 1.0 | 1.0 |
| Evaluation of sintered body (target) | Compositional ratio (atomic ratio) | In/(In + Ga + Zn) | 0.50 | 0.53 | 0.47 | 0.50 | 0.55 | 0.40 | 0.33 |
|  |  | Ga/(In + Ga + Zn) | 0.17 | 0.17 | 0.10 | 0.24 | 0.24 | 0.40 | 0.33 |
|  |  | Zn/(In + Ga + Zn) | 0.33 | 0.30 | 0.43 | 0.26 | 0.21 | 0.20 | 0.34 |
|  | X-ray diffraction measurement | $In_2O_3$ | ○ | ○ | ○ | ○ | ○ | ○ |  |
|  |  | $ZnGa_2O_4$ |  |  |  |  |  | ○ | ○ |
|  |  | $In_2Ga_2ZnO_7$ |  |  |  | ○ | ○ |  |  |
|  |  | $InGaZnO_4$ | ○ | ○ |  | ○ | ○ |  | ○ |
|  |  | $In_2O_3(ZnO)_2$ |  |  |  |  |  |  |  |
|  |  | Oxide A Other | ○ | ○ | ○ |  |  |  |  |
|  | Specific resistivity (mΩ · cm) |  | 3 | 3 | 3 | 3 | 3 | 16 | 15 |
|  | Relative density (%) |  | 98 | 98 | 98 | 98 | 98 | 97 | 96 |
| Production of TFT | Film-forming conditions | Method | DC | DC | DC | DC | DC | DC | DC |
|  |  | Total pressure (Pa) | 0.6 | 0.6 | 0.6 | 0.6 | 0.6 | 0.6 | 0.6 |
|  |  | Partial pressure of oxygen (Pa) | 0.2 | 0.2 | 0.2 | 0.2 | 0.2 | 0.2 | 0.2 |
|  |  | Ultimate pressure (Pa) | $<10^{-4}$ | $<10^{-4}$ | $<10^{-4}$ | $<10^{-4}$ | $<10^{-4}$ | $<10^{-4}$ | $<10^{-4}$ |
| Evaluation of TFT | Compositional ratio (atomic ratio) of active layer | In/(In + Ga + Zn) | 0.50 | 0.53 | 0.47 | 0.50 | 0.55 | 0.40 | 0.33 |
|  |  | Ga/(In + Ga + Zn) | 0.17 | 0.17 | 0.10 | 0.24 | 0.24 | 0.40 | 0.33 |
|  |  | Zn/(In + Ga + Zn) | 0.33 | 0.30 | 0.43 | 0.26 | 0.21 | 0.20 | 0.34 |
|  | Field-effect mobility (cm²/Vs) |  | 32 | 33 | 31 | 30 | 30 | 10 | 12 |
|  | S-factor |  | 0.4 | 0.4 | 0.4 | 0.4 | 0.4 | 0.6 | 0.5 |

TABLE 2

|  |  |  | Example | | | | | Comparative Example | | |
|---|---|---|---|---|---|---|---|---|---|---|
|  |  |  | 14 | 15 | 16 | 17 | 18 | 3 | 4 | 5 |
| Production of TFT | Film-forming conditions | Method | DC | DC | DC | DC | DC | RF co-sputtering | RF co-sputtering | RF co-sputtering |
|  |  | Total pressure (Pa) | 0.6 | 0.6 | 0.6 | 0.6 | 0.6 | 0.4 | 0.4 | 0.4 |
|  |  | Partial pressure of oxygen (Pa) | 0.2 | 0.2 | 0.2 | 0.2 | 0.03 | 0.02 | 0.02 | 0.02 |
|  |  | Ultimate pressure (Pa) | $<10^{-4}$ | $<10^{-4}$ | $<10^{-4}$ | $<10^{-4}$ | $<10^{-4}$ | $<10^{-4}$ | $<10^{-4}$ | $<10^{-4}$ |
| Evaluation of TFT | Compositional ratio (atomic ratio) of active layer | In/(In + Ga + Zn) | 0.60 | 0.50 | 0.50 | 0.60 | 0.60 | 0.60 | 0.50 | 0.50 |
|  |  | Ga/(In + Ga + Zn) | 0.20 | 0.10 | 0.24 | 0.20 | 0.20 | 0.20 | 0.10 | 0.24 |
|  |  | Zn/(In + Ga + Zn) | 0.20 | 0.40 | 0.26 | 0.20 | 0.20 | 0.20 | 0.40 | 0.26 |
|  | Field-effect mobility (cm²/Vs) |  | 36 | 33 | 30 | 37 | 36 | — | 17 | 12 |
|  | S-factor |  | 0.2 | 0.3 | 0.3 | 0.2 | 0.3 | >2.0 | 0.5 | 0.5 |

INDUSTRIAL APPLICABILITY

The thin film transistor according to the invention may be used for a display (particularly a large-area display).

Although only some exemplary embodiments and/or examples of the invention have been described in detail above, those skilled in the art will readily appreciate that many modifications are possible in the exemplary embodiments and/or examples without materially departing from the novel teachings and advantages of the invention.

Accordingly, all such modifications are intended to be included within the scope of the invention.

The documents described in the specification are incorporated herein by reference in their entirety.

The invention claimed is:

1. A sputtering target comprising an oxide sintered body that comprises In, Ga, and Zn in an atomic ratio that falls within a region 1, a region 2, or a region 3,
the region 1 being defined by:
0.58≤In/(In +Ga+Zn)≤0.68
0.15<Ga/(In+Ga+Zn)≤0.29,
the region 2 being defined by:
0.45≤In/(In+Ga+Zn)<0.58
0.09≤Ga/(In+Ga+Zn)<0.20, and
the region 3 being defined by:
0.45≤In/(In+Ga+Zn)<0.58
0.20≤Ga/(In+Ga+Zn)≤0.27; and
wherein the oxide sintered body has a specific resistivity of less than 15 mΩ·cm and a relative density of more than 97%.

2. A sputtering target comprising an oxide sintered body that comprises In, Ga, and Zn in an atomic ratio that falls within a region 1,
  the region 1 being defined by:
  $0.58 \leq \text{In}/(\text{In}+\text{Ga}+\text{Zn}) \leq 0.68$
  $0.15 < \text{Ga}/(\text{In}+\text{Ga}+\text{Zn}) \leq 0.29$,
    wherein the oxide sintered body comprises a compound having a homologous structure represented by $(\text{InGaO}_3)\text{ZnO}$ and a compound having a bixbyite structure represented by $\text{In}_2\text{O}_3$.

3. A sputtering target comprising an oxide sintered body that comprises In, Ga, and Zn in an atomic ratio that falls within a region 2,
  the region 2 being defined by:
  $0.45 \leq \text{In}/(\text{In}+\text{Ga}+\text{Zn}) < 0.58$
  $0.09 \leq \text{Ga}/(\text{In}+\text{Ga}+\text{Zn}) < 0.20$,
    wherein the oxide sintered body comprises an oxide for which a diffraction peak is observed by X-ray diffraction measurement (Cu-Kα) at an angle (2θ) of 7.0° to 8.4°, 30.6° to 32.0°, 33.8° to 35.8°, 53.5° to 56.5°, and 56.5° to 59.5°.

4. A sputtering target comprising an oxide sintered body that comprises In, Ga, and Zn in an atomic ratio that falls within a region 3,
  the region 3 being defined by:
  $0.45 \leq \text{In}/(\text{In}+\text{Ga}+\text{Zn}) < 0.58$
  $0.20 \leq \text{Ga}/(\text{In}+\text{Ga}+\text{Zn}) \leq 0.27$,
    wherein the oxide sintered body comprises a compound having a homologous structure represented by $(\text{InGaO}_3)\text{ZnO}$.

5. The sputtering target according to claim 2, wherein the oxide sintered body has a specific resistivity of less than 15 mΩ·cm and a relative density of more than 97%.

6. The sputtering target according to claim 3, wherein the oxide sintered body has a specific resistivity of less than 15 mΩ·cm and a relative density of more than 97%.

7. The sputtering target according to claim 4, wherein the oxide sintered body has a specific resistivity of less than 15 mΩ·cm and a relative density of more than 97%.

* * * * *